United States Patent
Leng

(10) Patent No.: US 10,860,159 B2
(45) Date of Patent: Dec. 8, 2020

(54) DISPLAY SUBSTRATE, DISPLAY PANEL AND DISPLAY DEVICE

(71) Applicant: Wuhan Tianma Micro-Electronics Co., Ltd., Wuhan (CN)

(72) Inventor: Chuanli Leng, Shanghai (CN)

(73) Assignee: WUHAN TIANMA MICRO-ELECTRONICS CO., LTD., Wuhan (CN)

( * ) Notice: Subject to any disclaimer, the term of this patent is extended or adjusted under 35 U.S.C. 154(b) by 335 days.

(21) Appl. No.: 15/810,600

(22) Filed: Nov. 13, 2017

(65) Prior Publication Data

US 2018/0067589 A1 Mar. 8, 2018

(30) Foreign Application Priority Data

Jun. 30, 2017 (CN) .......................... 2017 1 0522957

(51) Int. Cl.
| | | |
|---|---|---|
| *G06F 3/045* | (2006.01) | |
| *G01L 1/20* | (2006.01) | |
| *G02F 1/1333* | (2006.01) | |
| *G02F 1/1362* | (2006.01) | |
| *G06F 3/041* | (2006.01) | |
| *H01L 27/32* | (2006.01) | |
| *H01L 51/00* | (2006.01) | |
| *G01L 9/08* | (2006.01) | |

(Continued)

(52) U.S. Cl.
CPC .............. *G06F 3/045* (2013.01); *G01L 1/205* (2013.01); *G02F 1/13338* (2013.01); *G02F 1/133305* (2013.01); *G02F 1/136286* (2013.01); *G06F 3/0412* (2013.01); *H01L 27/323* (2013.01); *H01L 51/0097* (2013.01); *G01L 9/08* (2013.01); *G02F 1/1368* (2013.01); *G06F 2203/04102* (2013.01); *H01L 27/124* (2013.01); *H01L 27/3262* (2013.01); *H01L 27/3276* (2013.01); *H01L 2251/5338* (2013.01); *Y02E 10/549* (2013.01)

(58) Field of Classification Search
CPC ......... G06F 2203/04105; G06F 3/0414; G06F 3/0412
See application file for complete search history.

(56) References Cited

U.S. PATENT DOCUMENTS

2011/0115547 A1* 5/2011 Wang ....................... G06F 3/033
327/516
2013/0265256 A1* 10/2013 Nathan .................. G06F 3/0414
345/173

(Continued)

FOREIGN PATENT DOCUMENTS

| CN | 105808029 A | 7/2016 |
|---|---|---|
| CN | 106354334 A | 1/2017 |
| CN | 106405909 A | 2/2017 |

(Continued)

*Primary Examiner* — Koosha Sharifi-Tafreshi
(74) *Attorney, Agent, or Firm* — Alston & Bird LLP

(57) ABSTRACT

A display substrate, a display panel and a display device are provided. The display substrate includes a display area with a non-display area surrounding the display area first flexible substrate; a plurality of pressure sensors on the first flexible substrate and in the display area; and a second flexible substrate located at a side of the pressure sensors facing away from the first flexible substrate. The second flexible substrate covers the pressure sensors.

20 Claims, 11 Drawing Sheets

(51) Int. Cl.
    *G02F 1/1368*    (2006.01)
    *H01L 27/12*     (2006.01)

(56) References Cited

U.S. PATENT DOCUMENTS

2017/0010704 A1* 1/2017 Chen ................. G06F 3/041
2017/0285864 A1* 10/2017 Pedder ................ G01L 1/205

FOREIGN PATENT DOCUMENTS

CN      106648236 A    5/2017
KR      20160018894 A  2/2016

* cited by examiner

DISPLAY SUBSTRATE, DISPLAY PANEL AND DISPLAY DEVICE

CROSS-REFERENCES TO RELATED APPLICATIONS

This application claims priority to Chinese patent application No. CN201710522957.6, filed on Jun. 30, 2017, the disclosure of which is incorporated herein by reference in its entirety.

TECHNICAL FIELD

Embodiments of the present disclosure relate to the field of touch technologies, and in particular relate to a display substrate, a display panel and a display device.

BACKGROUND

At present, a touch display screen is provided in more and more electronic devices, e.g., an information inquiry machine in a public service hall, or a computer or a mobile phone in daily life and work. A user can operate the electronic device by simply touching icons on the touch display screen with a finger, thereby getting rid of the keyboard and mouse operations and making a human-computer interaction more straightforward. To better meet user requirements, the touch display screen is typically provided with one or more pressure sensors for detecting touch pressure values when the user touches the touch display screen.

A bridge strain sensor is a pressure sensor capable of detecting the amount of a touch pressure. By detecting an in-plane deformation caused by a strain in a direction z, the bridge strain sensor measures a resistance variation of the sensor to calculate the amount of the touch pressure.

In a related art, the bridge strain sensor is generally disposed in a non-display area. However, the touch pressing generally occurs in a display area. When a finger presses the display area, the deformation of the strain sensor in the non-display area is small, resulting in insufficient pressure detection sensitivity. In particular, for a flexible display panel, when the finger presses the display area, most of strain relief occurs in the display area of the flexible display panel, and the strain sensor located in the non-display area is not even deformed.

SUMMARY

In view of the above, embodiments of the present disclosure provide a display substrate, a display panel and a display device to solve a technical problem of insensitive touch pressure detection in the related art caused by small deformations of the pressure sensors in the non-display area of the flexible display substrate.

According to a first aspect, an embodiment of the present disclosure provides a display substrate including a display area with a non-display area surrounding the display area. The display substrate further includes: a first flexible substrate; a plurality of pressure sensors on the first flexible substrate and in the display area; and a second flexible substrate located at a side of the plurality of pressure sensors, wherein the second flexible substrate is facing away from the first flexible substrate and covering the plurality of pressure sensors.

According to a second aspect, an embodiment of the present disclosure further provides a display panel including the display substrate described in the first aspect and a counter substrate opposite to the display substrate.

According to a third aspect, an embodiment of the present disclosure further provides a display device including the display panel described in the second aspect.

According to the display substrate, the display panel and the display device of the present disclosure, the display substrate includes a display area with a non-display area surrounding the display area, and further includes: a first flexible substrate; a plurality of pressure sensors on the first flexible substrate and in the display area; and a second flexible substrate located at a side of the pressure sensors, wherein the second flexible substrate is facing away from the first flexible substrate. The second flexible substrate covers the pressure sensors.

BRIEF DESCRIPTION OF DRAWINGS

In order to more clearly illustrate the technical solutions in embodiments of the present disclosure, the drawings, which are used in the description of embodiments of the present disclosure, are briefly described below. Apparently the drawings are some embodiments of the present disclosure, and other drawings may be obtained by those skilled in the art based on these drawings on the premise that no creative work is expended.

DETAILED DESCRIPTION

In order to make the purpose, technical solutions and advantages of the present disclosure more clear, the technical solutions of the present disclosure will be described clearly and completely by way of embodiments with reference to the accompanying drawings in embodiments. Apparently, the described embodiments are part of the present disclosure. Based on embodiments in the present disclosure, all other embodiments obtained by those of ordinary skill in the art without creative work are within the scope of the present disclosure.

Figure 1A:
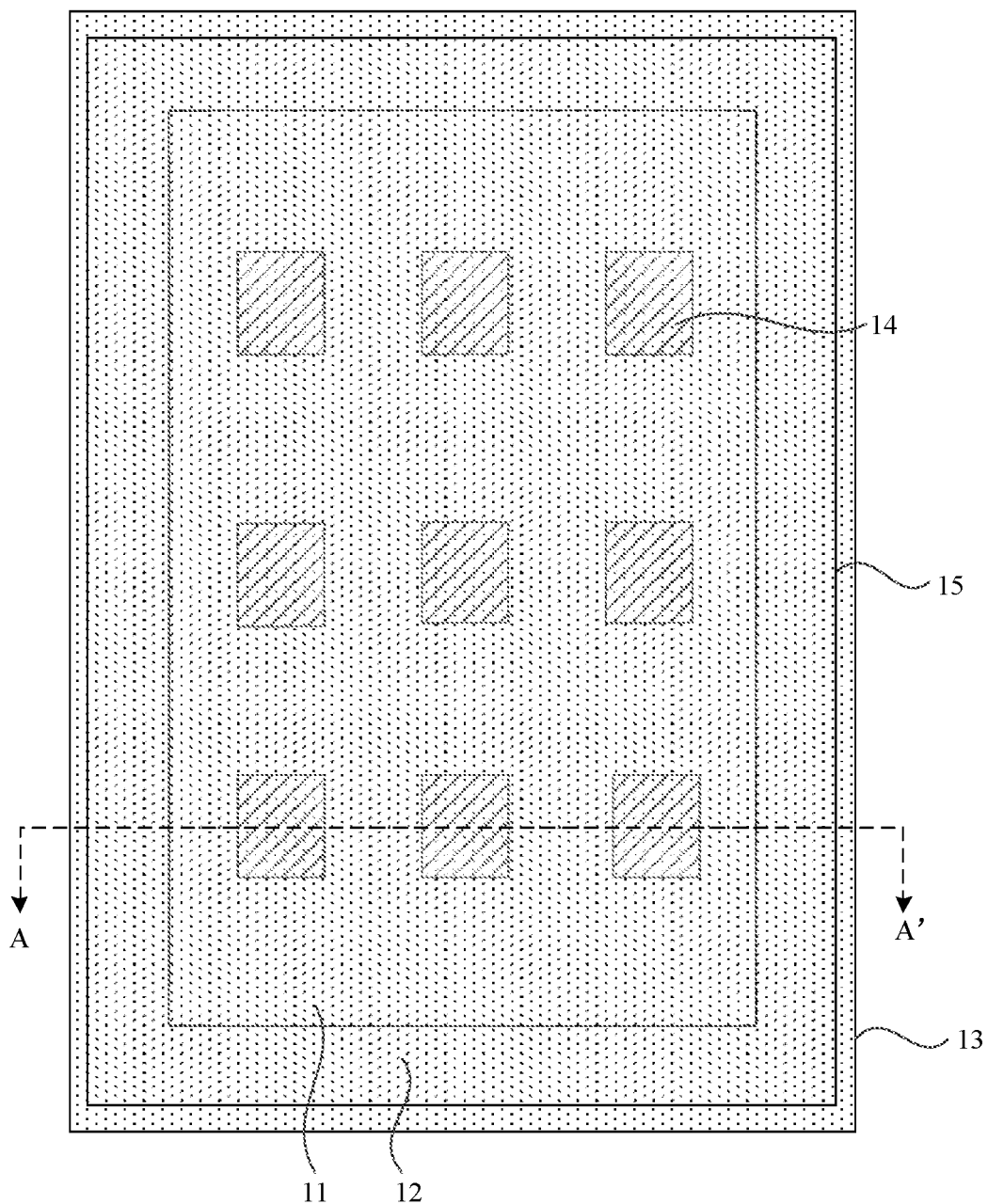
FIG. 1A is a schematic view of a structure of a display substrate according to an embodiment of present disclosure.
Figure 1B:
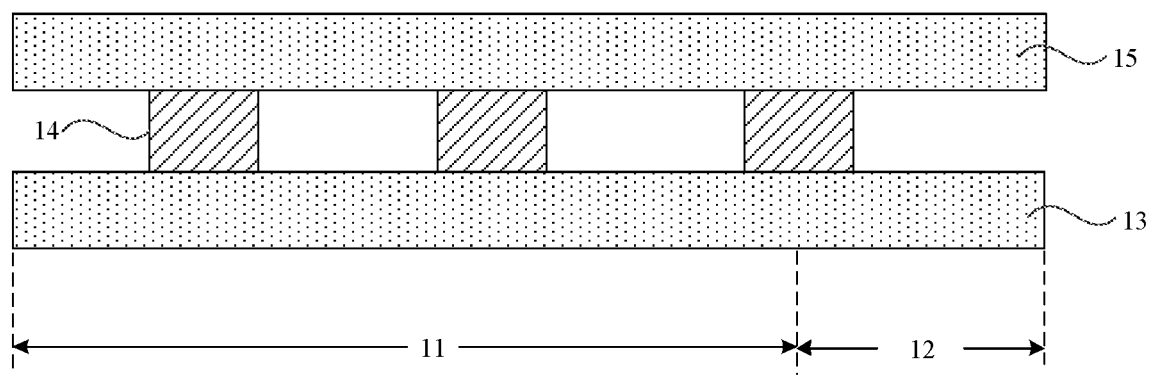
FIG. 1B is a schematic cross sectional view of the display substrate in FIG. 1A taken along a section line A-A'.

FIG. 1A is a schematic view of a structure of a display substrate according to an embodiment of present disclosure. FIG. 1B is a schematic cross sectional view of the display substrate in FIG. 1A taken along a section line A-A'. As shown in FIG. 1A and FIG. 1B, the display substrate of the present embodiment may have a display area 11 and a non-display area 12 surrounding the display area 11. The display substrate may include: a first flexible substrate 13, a plurality of pressure sensors 14 and a second flexible substrate 15.

The plurality of pressure sensors 14 are disposed in the display area 11 and on the first flexible substrate 13.

The second flexible substrate 15 is disposed at a side of the plurality of pressure sensors 14 facing away from the first flexible substrate 13. The second flexible substrate 15 covers the pressure sensors 14.

Exemplarily, the plurality of pressure sensors 14 are located in the display area 11. Touching and pressing by a user typically take place in the display area 11 of the display substrate, so providing multiple pressure sensors 14 within the display area 11 ensures that the pressure sensors 14 can receive pressure signals and can be deformed according to the pressure signals and ensures large touch-pressure-based deformations and high pressure detection sensitivity. This avoids weak pressure signals received by the pressure sensors 14, small deformations and low pressure detection sensitivity when the pressure sensors 14 are disposed in the non-display area 12 in the related art. Meanwhile, the pressure sensors 14 are disposed between the first flexible substrate 13 and the second flexible substrate 15, and the second flexible substrate 15 completely covers the pressure sensors 14, so the pressure sensors 14 do not affect the aperture ratio of the display substrate at all and ensure a large aperture ratio of the display substrate although the pressure sensors 14 are disposed in the display area 11. Optionally, the plurality of pressure sensors 14 are disposed between the first flexible substrate 13 and the second flexible substrate 15. Compared with rigid substrates, flexible substrates have larger deformations under the same touch pressure; therefore, disposing the pressure sensors 14 between the first flexible substrate 13 and the second flexible substrate 15 ensures larger deformations and higher touch pressure detection sensitivity of the pressure sensors 14 through the deformations of the first flexible substrate 13 and the second flexible substrate 15. It should be noted that, in the manufacturing of the flexible substrate in the related art, a layer of flexible material (equivalent to the first flexible substrate 13) is first deposited on a rigid substrate, then other display components are disposed on the flexible material, and the rigid substrate is spalled to obtain the flexible display substrate after other display components are manufactured. Since a laser lift-off technology is typically employed during spalling the rigid substrate, the flexible material (the first flexible substrate 13) may be damaged during spalling of the rigid substrate. The display substrate of the present embodiment further includes the second flexible substrate 15 in addition to the first flexible substrate 13, and the plurality of pressure sensors 14 are disposed between the first flexible substrate 13 and the second flexible substrate 15. If the first flexible substrate 13 is damaged during manufacturing of the display substrate and if the second flexible substrate 15 on the plurality of pressure sensors 14 is not damaged, then the second flexible substrate 15 has a large deformation under touch pressure, increasing the deformations of the pressure sensors 14 and ensuring high touch pressure detection sensitivity. Meanwhile, the second flexible substrate 15 covers the pressure sensors 14, ensuring that the aperture ratio of the display substrate is not affected by the pressure sensors 14 disposed in the display area 11. If the first flexible substrate 13 is not damaged, then the deformations of the pressure sensors 14 are increased by the combined effect of the first flexible substrate 13 and the second flexible substrate 15, ensuring large deformations and high pressure detection sensitivity of the pressure sensors 14. Additionally, the second flexible substrate 15 covers the pressure sensors 14, so the pressure sensors 14 disposed in the display area 11 do not affect the aperture ratio of the display substrate.

To sum up, in the display substrate provided by the embodiment of the present disclosure, the plurality of pressure sensors are disposed in the display area and between the first flexible substrate and the second flexible. This not only ensures that the pressure sensors have larger deformations and higher touch pressure detection sensitivity, but also ensures that the aperture ratio of the display substrate is not affected and is large even if the pressure sensors are disposed in the display area.

Optionally, material of the first flexible substrate 13 and the second flexible substrate 15 may be Polyimide or Nano-silver paste.

Figure 2:
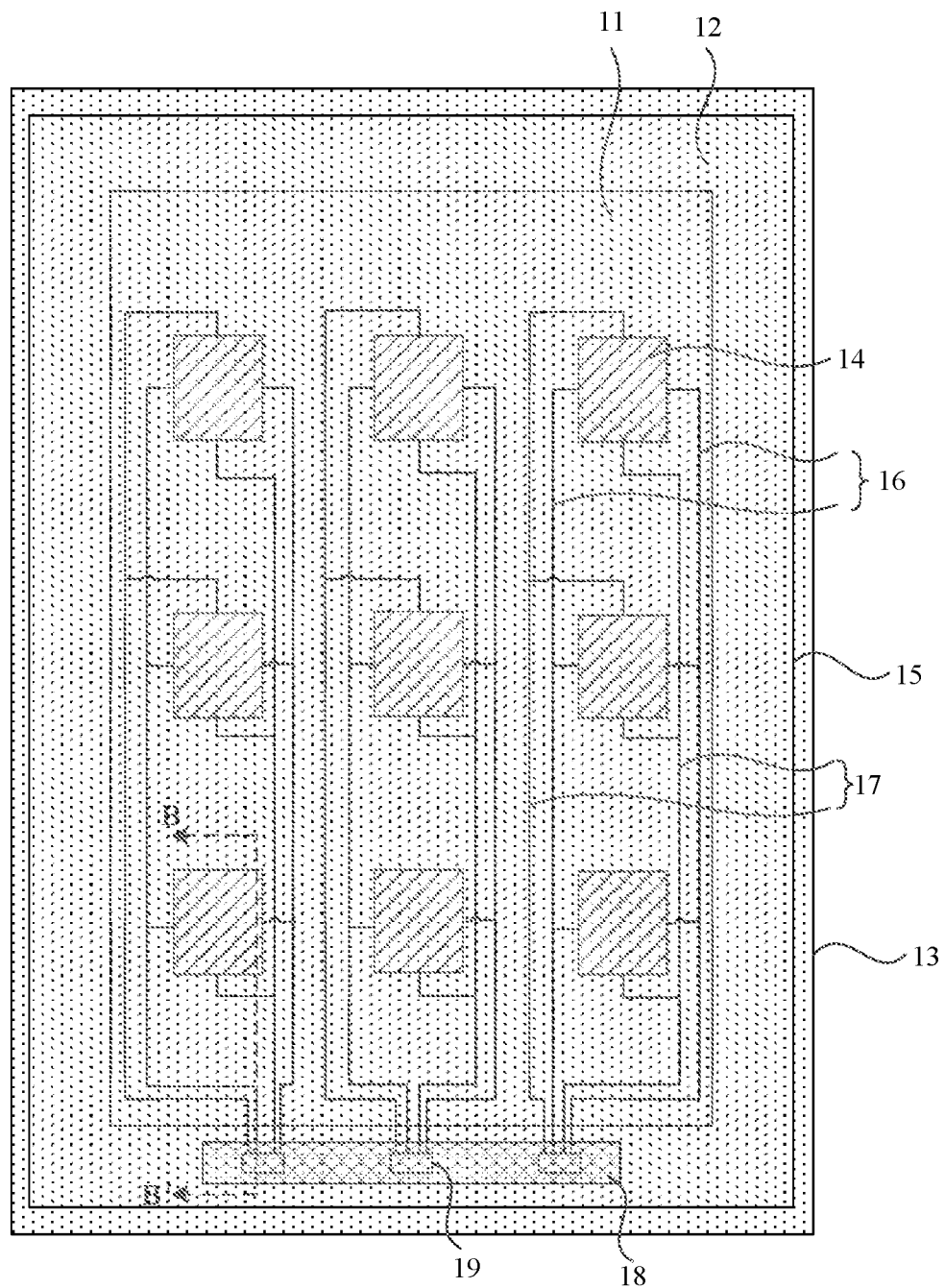
FIG. 2 is a schematic view of a structure of another display substrate according to an embodiment of present disclosure.

Optionally, FIG. 2 is a schematic view of a structure of another display substrate according to an embodiment of present disclosure. The display substrate of the present embodiment may further include a bias voltage signal line 16 and a strain voltage signal line 17. With reference to FIG. 2, the bias voltage signal line 16 and the strain voltage signal line 17 are arranged in the same layer as the pressure sensors 14. That is, the bias voltage signal line 16 and the strain voltage signal line 17 are disposed between the first flexible substrate 13 and the second flexible substrate 15, and the bias voltage signal line 16 and the strain voltage signal line 17 are electrically connected to the pressure sensors 14 separately. Optionally, the pressure sensor 14 may include at least four connecting terminals, the bias voltage signal line 16 is configured to output a bias voltage signal to two opposite ones of the at least four connecting terminals, and the strain voltage signal line 17 is configured to output a strain voltage signal to another two opposite ones of the at least four connecting terminals.

Exemplarily, two opposite connecting terminals of the pressure sensor 14 are connected to the bias voltage signal line 16, by which the bias voltage signal is inputted. Another two opposite connecting terminals are connected to the strain voltage signal line 17, by which the stain voltage signal is outputted. When a touch pressure is applied, four connecting terminals of the pressure sensor 14 are deformed, the outputted strain voltage signal is changed, and the touch pressure is detected according to the change in strain voltage signal, ensuring a sensitive touch pressure detection. Meanwhile, the bias voltage signal line 16 and the strain voltage signal line 17 are disposed between the first flexible substrate 13 and the second flexible substrate 15 and the second flexible substrate 15 can completely cover the bias voltage signal line 16 and the strain voltage signal line 17; therefore, when the bias voltage signal line 16 and the strain voltage signal line 17 are disposed in the display area 11 of the display substrate, the aperture ratio of the display substrate is not affected by the bias voltage signal line 16 and the strain voltage signal line 17 and the display panel has a large aperture ratio. When the bias voltage signal line 16 and the strain voltage signal line 17 are disposed in the non-display area 12 of the display substrate, since the second flexible substrate 15 can completely cover the bias voltage signal line 16 and the strain voltage signal line 17, the display substrate can have a narrow bezel.

Figure 3A:
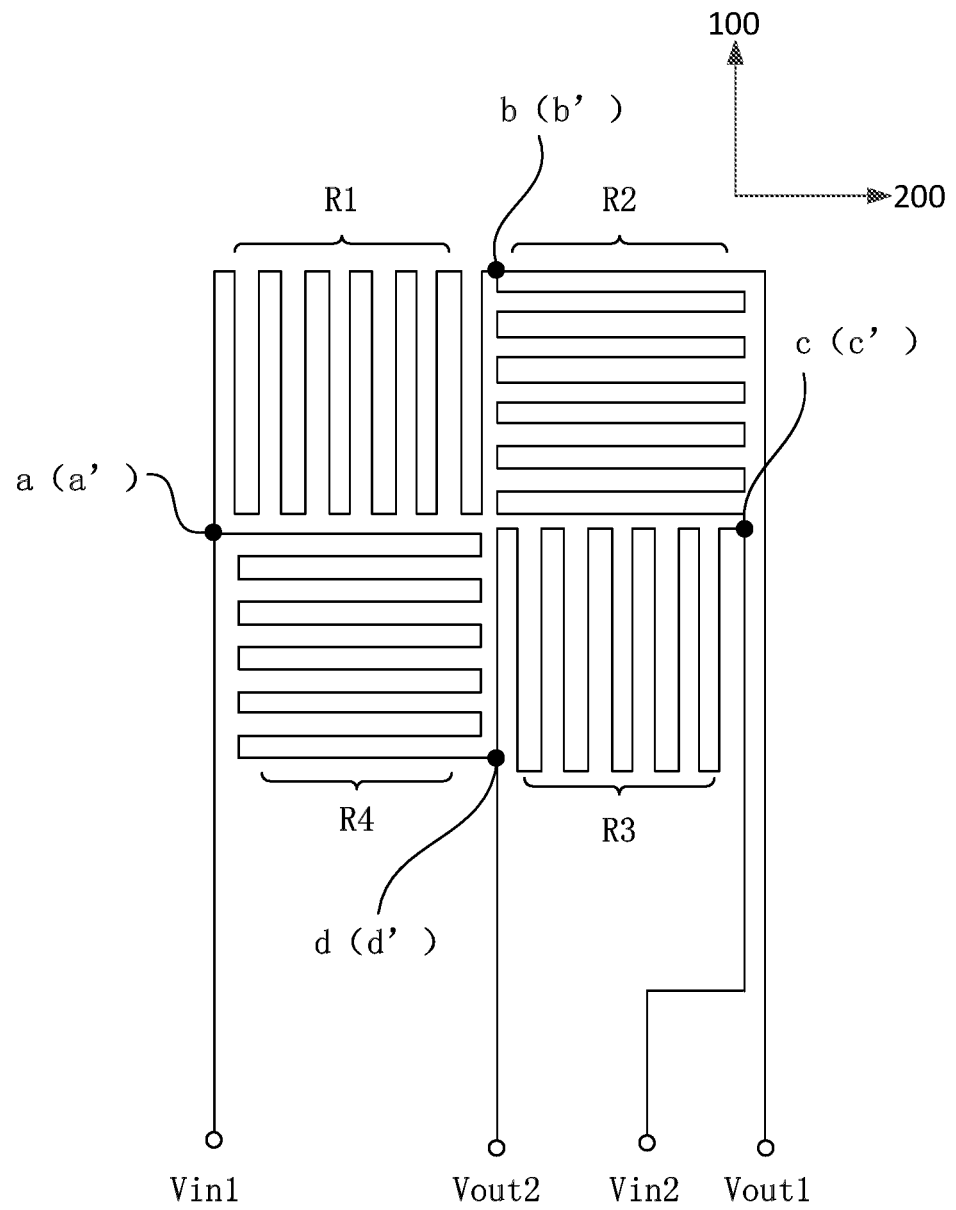
FIG. 3A is a schematic view of a structure of a pressure sensor according to an embodiment of the present disclosure.
Figure 3B:
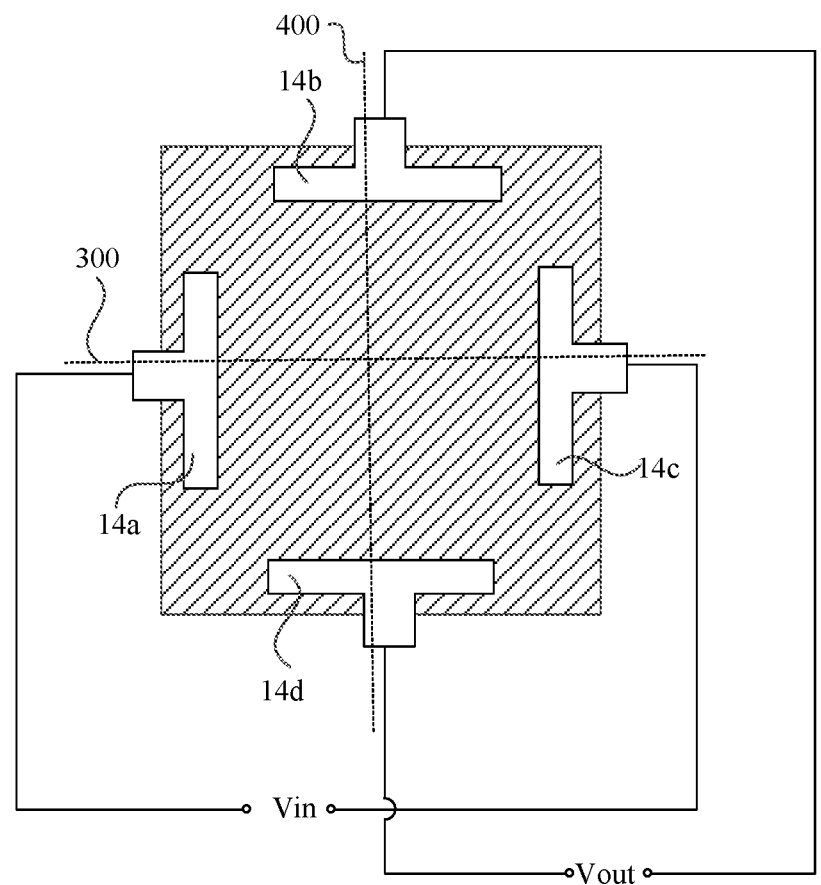
FIG. 3B is a schematic view of a structure of another pressure sensor according to an embodiment of the present disclosure.

Optionally, the pressure sensor 14 may be a bridge pressure sensor or a semiconductor pressure sensor. FIG. 3A is a schematic view of a structure of a pressure sensor according to an embodiment of the present disclosure. FIG. 3B is a schematic view of a structure of another pressure sensor according to an embodiment of the present disclosure. The pressure sensor 14 shown in FIG. 3A is a bridge pressure sensor. The pressure sensor 14 shown in FIG. 3B is a semiconductor pressure sensor.

With reference to FIG. 3A, when the pressure sensor 14 is a bridge pressure sensor, the bridge pressure sensor may include a first sense resistor R1, a second sense resistor R2, a third sense resistor R3 and a fourth sense resistor R4. A first terminal of the first sense resistor R1 and a second terminal a' of the fourth sense resistor R4 are electrically connected to a first bias voltage signal input terminal Vin1. A second terminal b of the first sense resistor R1 and a first terminal b' of the second sense resistor R2 are electrically connected to a strain voltage signal measuring terminal Vout1. A second terminal c of the second sense resistor R2 and a first terminal c' of the third sense resistor R3 are electrically connected to a second bias voltage signal input terminal Vin2. A second terminal d of the third sense resistor R3 and a first terminal d' of the fourth sense resistor R4 are electrically connected to a second strain voltage signal measuring terminal Vout2. A component of an extension length from the first terminal a to the second terminal b of the first sense resistor R1 in a first extension direction 100 is greater than that in a second extension direction 200. A component of an extension length from the first terminal b' to the second terminal c of the second sense resistor R2 in the second extension direction 200 is greater than that in the first extension direction 100. A component of an extension length from the first terminal c' to the second terminal d of the third sense resistor R3 in the first extension direction 100 is greater than that in the second extension direction 200. A component of an extension length from the first terminal d' to the second terminal a' of the fourth sense resistor R4 in the second extension direction 200 is greater than that in the first extension direction 100. In the present embodiment, the first sense resistor R1 and the third sense resistor R3 sense the strain in the first direction 100, and the second sense resistor R2 and the fourth resistor R4 sense the strain in the second direction 200, so that the first sense resistor R1, the second sense resistor R2, the third sense resistor R3 and the fourth sense resistor R4 may be distributed in a same space or at positions close to each other. Therefore, the first sense resistor R1, the second sense resistor R2, the third sense resistor R3 and the fourth sense resistor R4 have a synchronous temperature change, thus eliminating an influence of temperature differences, and can sense the deformation of the display substrate, thus improving a pressure sensing accuracy. Optionally, the first extension direction 100 is perpendicular to the second extension direction 200.

With reference to FIG. 3B, when the pressure sensor 14 is a semiconductor pressure sensor, the semiconductor pressure sensor may be a diffused-silicon piezoresistive pressure sensor. For example, the semiconductor pressure sensor may be an amorphous silicon film or a polysilicon film. Optionally, the semiconductor pressure sensor may be a four-terminal diffused-silicon piezoresistive pressure sensor. Strain gauges are formed on a silicon wafer through ion implantation and then are encapsulated to produce the four-terminal diffused-silicon piezoresistive pressure sensor. The semiconductor pressure sensor may include a first connecting terminal 14a, a second connecting terminal 14b, a third connecting terminal 14c and a fourth connecting terminal 14d. The first connecting terminal 14a and the third connecting terminal 14c are oppositely arranged. The second connecting terminal 14b and the fourth connecting terminal 14d are oppositely arranged. The first connecting terminal 14a and the third connecting terminal 14c are configured to receive the bias voltage signal Vin. The second connecting terminal 14b and the fourth connecting terminal 14d are configured to output the stain voltage signal Vout. A first straight line 300 where the first connecting terminal 14a and the third connecting terminal 14c are located intersects a second straight line 400 where the second connecting terminal 14b and the fourth connecting terminal 14d are located. In the present embodiment, the first connecting terminal 14a and the third connecting terminal 14c sense the strain in the direction of the first straight line 300, and the second connecting terminal 14b and the fourth connecting terminal 14d sense the strain in the direction of the second straight line 400, so that the first connecting terminal 14a, the second connecting terminal 14b, the third connecting terminal 14c and the fourth connecting terminal 14d may be distributed in a same space or at positions close to each other. In this way, the first connecting terminal 14a, the second connecting terminal 14b, the third connecting terminal 14c and the fourth connecting terminal 14d have a synchronous temperature change, thus eliminating an influence of temperature differences, and can sense the deformation of the display substrate, thus improving a pressure sensing accuracy. Optionally, an extension direction of the first straight line 300 is perpendicular to a second extension direction of the second straight line 400.

Figure 4:
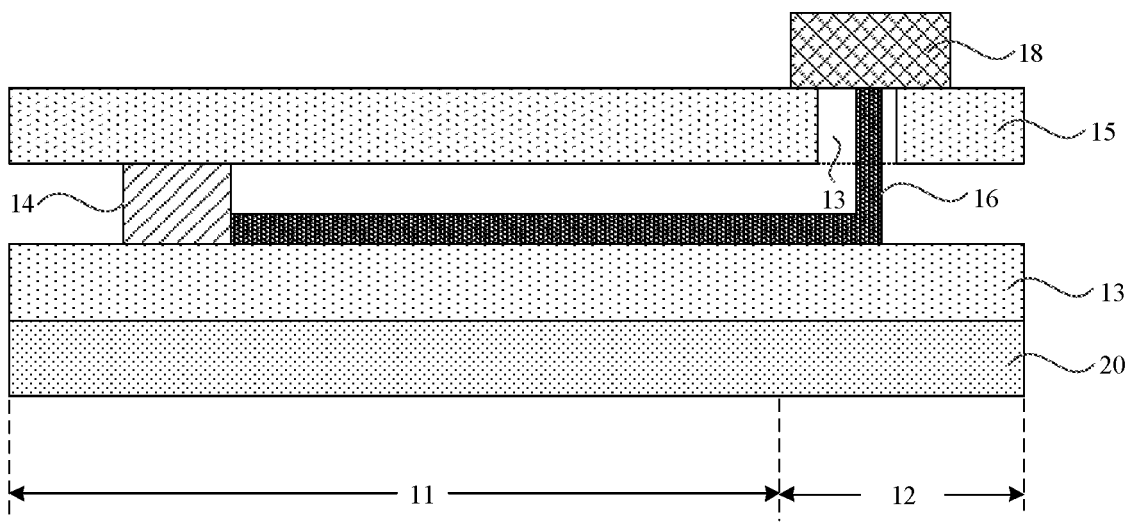
FIG. 4 is a schematic cross sectional view of the display substrate in FIG. 2 taken along a section line B-B'.

Optionally, FIG. 4 is a schematic cross sectional view of the display substrate in FIG. 2 taken along a section line B-B'. With reference to FIG. 2 and FIG. 4, the display substrate provided by the embodiment of the present disclosure may further include a driver circuit layer 18. The driver circuit layer 18 is at a side of the second flexible substrate 15 facing away from the pressure sensors 14, and is in the non-display area 12. The second flexible substrate 15 is formed with contact holes 19. The bias voltage signal line 16 and the strain voltage signal line 17 are electrically connected to the driver circuit layer 18 via the contact holes 19. FIG. 4 only exemplarily illustrates that the bias voltage signal line 16 and the strain voltage signal line 17 are electrically connected to the driver circuit layer 18 via the contact holes 19. Optionally, the contact holes 19 may be disposed at a step area between the display area 11 and the non-display area 12. As shown in FIG. 2 or FIG. 4, such configuration ensures that the aperture ratio of the display area 11 is not affected by the contact holes 19.

Optionally, continuing to refer to FIG. 4, the display substrate provided by the embodiment of the present disclosure may further include a flexible plate 20. The flexible plate 20 is at a side of the first flexible substrate 13 facing away from the pressure sensors 14. After the flexible plate 20 is added at the side of the first flexible substrate 13, the deformations of the pressure sensors 14 can be further increased by the deformations of the flexible plate 20 when the display substrate is subjected to the touch pressure, ensuring a more sensitive touch pressure detection. Optionally, the Young's modulus value of the flexible plate 20 is less than that of the first flexible substrate 13 and that of the second flexible substrate 15. Young's modulus is a physical quantity that characterizes the properties of the material. The value of the Young's modulus represents a rigidity of the material. A larger Young's modulus indicates less tendency to material deformation. Therefore, in the case where the Young's modulus value of the flexible plate 20 is less than that of the first flexible substrate 13 and that of the second flexible substrate 15, the flexible plate 20 is more susceptible to deformation than the first flexible substrate 13 and the second flexible substrate 15. In particular, in the case where the first flexible substrate 13 is damaged during manufacturing of the display substrate, the pressure sensors 14 amount to being disposed between the second flexible substrate 15 and the flexible plate 20. In addition, the second flexible substrate 15 covers the pressure sensors 14. Such configurations, on the one hand, increase the deformations of the pressure sensors 14 by the relative large deformations of the flexible plate 20 and ensure a more sensitive touch pressure detection; and, on the other hand, ensure a large aperture ratio of the display substrate that is not affected by the pressure sensors 14 disposed in the display area 11 of the display substrate.

Optionally, continuing to refer to FIG. 2, the display substrate provided by the embodiment of the present disclosure may further include a plurality of pressure sensors 14 arranged in a matrix. Respective two opposite connecting terminals of the pressure sensors 14 in the same column are electrically connected to the same bias voltage signal line 16, and respective another two opposite connecting terminals of the pressure sensors 14 in the same column are electrically connected to the same strain voltage signal line 17. In this way, the same connecting terminals of the pressure sensors 14 arranged in the same column are electrically connected to one and the same signal line, ensuring a simpler design, a smaller number of signal lines and a lower power consumption for the display substrate.

It should be noted that detection blind spots exist during the pressure detection process, because when the touch position is on a bisector of an angle between two detection directions of the pressure sensor, the deformations of the pressure sensor caused by the touch pressure in the two detection directions are the same. Therefore, the touch pressure cannot be detected by only one pressure sensor. In the case where the display substrate includes a plurality of pressure sensors which have the same detection directions and the plurality of pressure sensors are arranged in a matrix, the touch pressure cannot be detected by two pressure sensors and detection blind spots also exist if the touch position is located not only at the bisector of an angle between two detection directions of the pressure sensor but also at a midperpendicular of two adjacent pressure sensors in the same row or in the same column. Therefore, to avoid detection blind spots, embodiments of the present disclosure provide another two structures for the display substrate.

Figure 5:
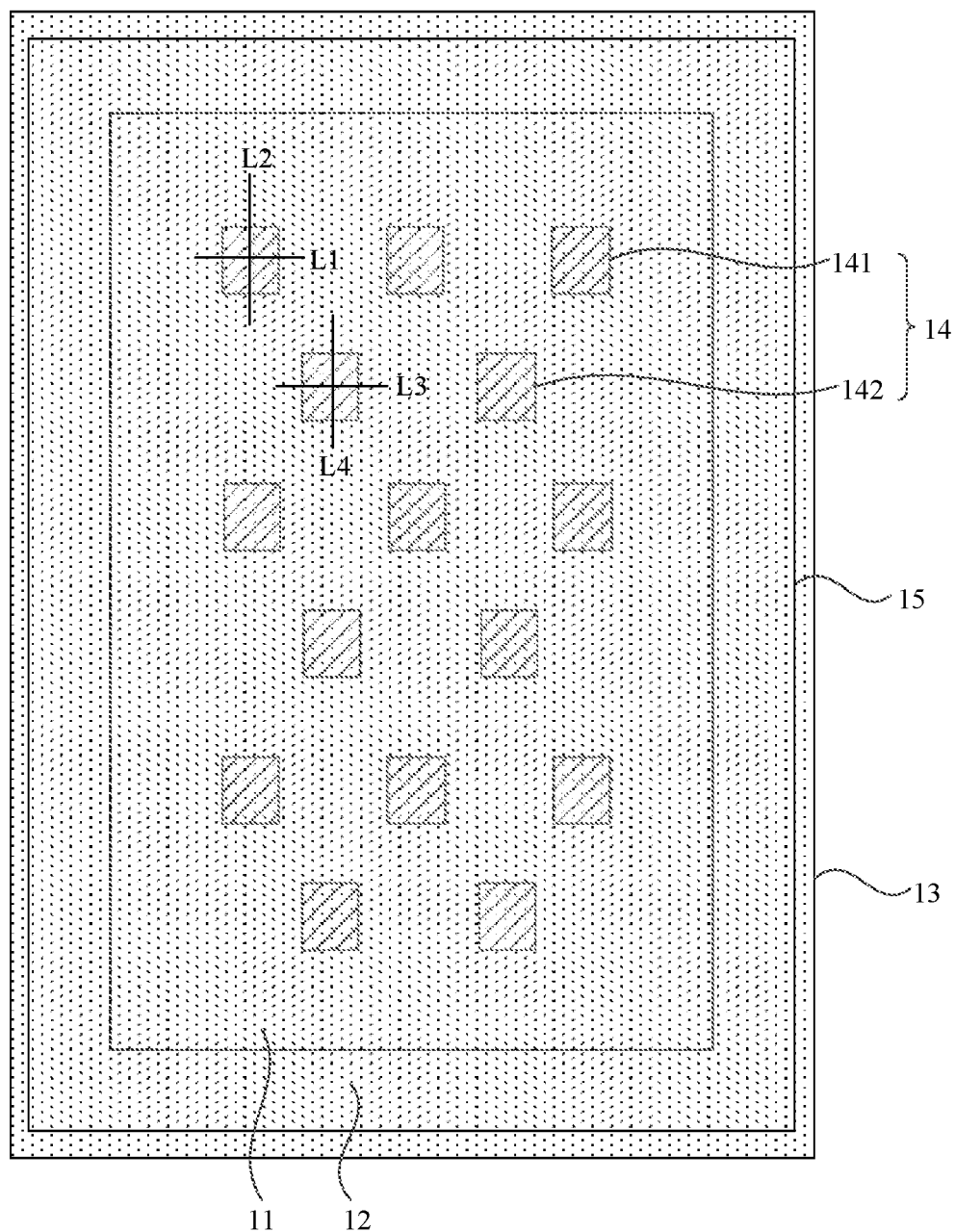
FIG. 5 is a schematic view of a structure of another display substrate according to an embodiment of present disclosure.

Optionally, FIG. 5 is a schematic view of a structure of another display substrate according to an embodiment of present disclosure. As shown in FIG. 5, the plurality of pressure sensors 14 may include at least one first pressure sensor 141 and at least one second pressure sensor 142. FIG. 5 exemplarily illustrates that the display substrate includes a plurality of first pressure sensors 141 arranged in rows and a plurality of second pressure sensors 142 arranged in rows. As shown in FIG. 5, either the plurality of first pressure sensors are in odd-numbered rows and the plurality of second pressure sensors are in even-numbered rows, or the plurality of first pressure sensors are in even-numbered rows and the plurality of second pressure sensors are in odd-numbered rows. The first pressure sensors 141 and the second pressure sensors 142 are alternately arranged in a column direction. FIG. 5 exemplarily illustrates that the first pressure sensors 141 are in odd-numbered rows and the second pressure sensors 142 are in even-numbered rows.

As shown in FIG. 5, the first pressure sensor 141 includes a first detection direction L1 and a second detection direction L2, and the first detection direction intersects the second detection direction L2. FIG. 5 exemplarily illustrates that the first detection direction is orthogonal to the second detection direction L2. The second pressure sensor 142 includes a third detection direction L3 and a fourth detection direction L4, and the third detection direction L3 intersects the fourth detection direction L4. FIG. 5 exemplarily illustrates that the third detection direction L3 is orthogonal to the fourth detection direction L4. As shown in FIG. 5, the first detection direction L1 is the same as the third detection direction L3, and the second detection direction L2 is the same as the fourth detection direction L4. The first pressure sensor 141 and the second pressure sensor 142 of the display substrate shown in FIG. 5 have the same detection directions. The plurality of first pressure sensors are in odd-numbered rows and the plurality of second pressure sensors are in even-numbered rows, or the plurality of first pressure sensors are in even-numbered rows and the plurality of second pressure sensors are in odd-numbered rows. The rows of first pressure sensors 141 and the rows of second pressure sensors 142 are alternately arranged. The first pressure sensors 141 and the second pressure sensors 142 are arranged in different columns. In this way, although the display substrate includes a plurality of pressure sensors which have the same detection direction, the second pressure sensors 142 can detect pressure at the detection blind spots of the first pressure sensors 141 and the first pressure sensors 141 can detect pressure at the detection blind spots of the second pressure sensors 142. Therefore, the display substrate as a whole has no detect blind spot, ensuring the accuracy of touch pressure detection. Further, since the first pressure sensors 141 and the second pressure sensors 142 are in the display area 11 of the display substrate, the pressure detection is sensitive. Furthermore, the second flexible substrate 15 covers the first pressure sensors 141 and the second pressure sensors 142, so the arrangement of the first pressure sensors 141 and the second pressure sensors 142 has no effect on the aperture ratio of the display substrate, ensuring that the display substrate has a large aperture ratio. Meanwhile, the first pressure sensors 141 and the second pressure sensors 142 are disposed between the first flexible substrate 13 and the second flexible substrate 15, the deformations of the first pressure sensors 141 and the second pressure sensors 142 are increased by the deformations of the first flexible substrate 13 and the second flexible substrate 15, ensuring a more sensitive touch pressure detection.

Figure 6:
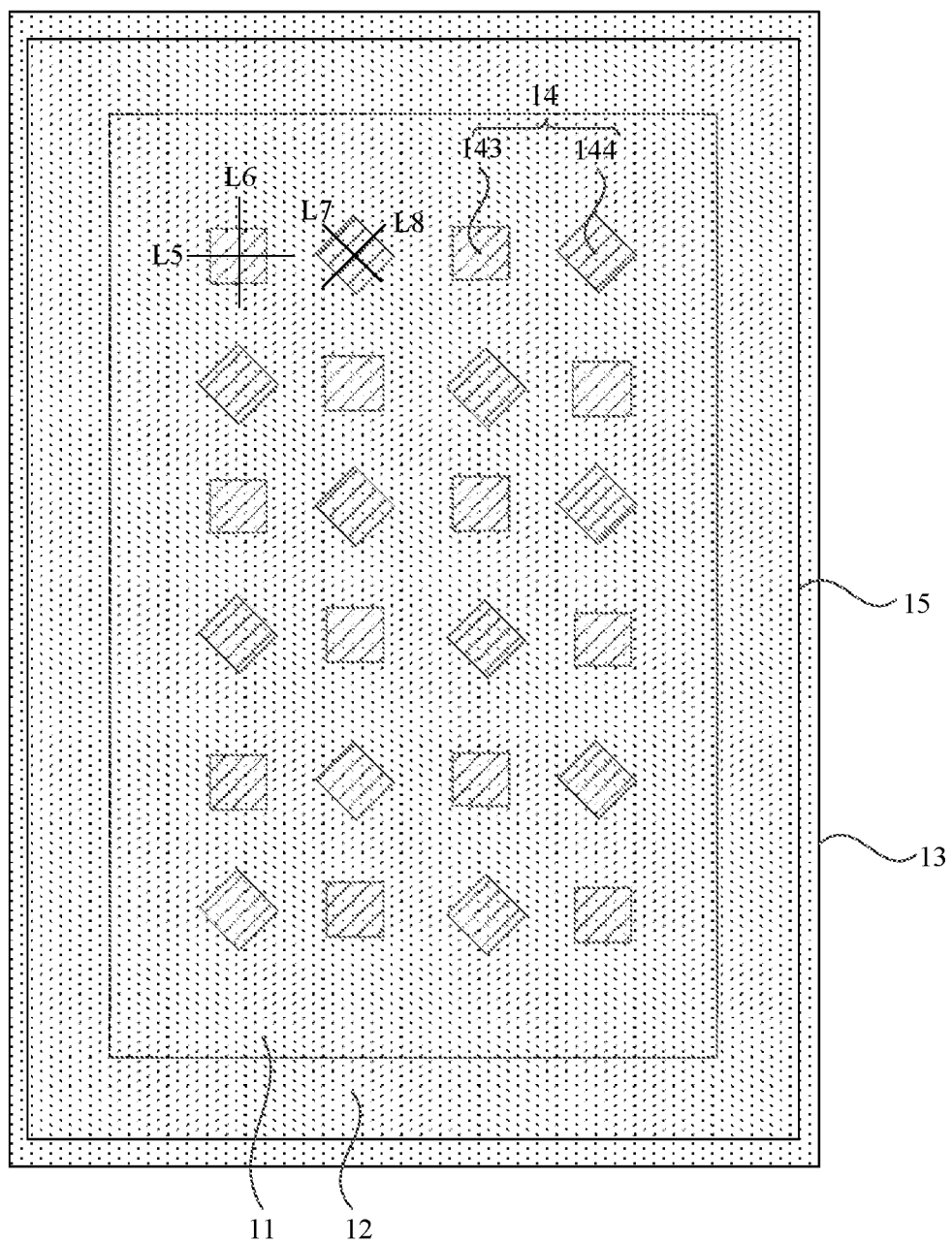
FIG. 6 is a schematic view of a structure of another display substrate according to an embodiment of present disclosure.

Optionally, FIG. 6 is a schematic view of a structure of another display substrate according to an embodiment of present disclosure. As shown in FIG. 6, the plurality of pressure sensors 14 may include at least one third pressure sensor 143 and at least one fourth pressure sensor 144. FIG. 6 exemplarily illustrates that the display substrate includes a plurality of third pressure sensors 143 and a plurality of fourth pressure sensors 144. As shown in FIG. 6, the third pressure sensors 143 and the fourth pressure sensors 144 are alternately arranged.

As shown in FIG. 6, the third pressure sensor 143 includes a fifth detection direction L5 and a sixth detection direction L6, and the fifth detection direction L5 intersects the sixth detection direction L6. FIG. 6 exemplarily illustrates that the fifth detection direction L5 is orthogonal to the sixth detection direction L6. The fourth pressure sensor 144 includes a seventh detection direction L7 and an eighth detection direction L8, and the seventh detection direction L7 intersects the eighth detection direction L8. FIG. 6 exemplarily illustrates that the seventh detection direction L7 is orthogonal to the eighth detection direction L8. As shown in FIG. 6, the fifth detection direction L5 is different from the seventh detection direction L7, and the sixth detection direction L6 is different from the eighth detection direction L8. Optionally, an angle between the fifth detection direction L5 and the seventh detection direction L7 may be 45 degrees, and an angle between the sixth detection direction L6 and the eighth detection direction L8 may be 45 degrees. The third pressure sensor 143 and the fourth pressure sensor 144 of the display substrate shown in FIG. 6 have different detection directions. The third pressure sensors 143 and the fourth pressure sensors 144 are alternately arranged in the same rows, so the fourth pressure sensors 144 can detect pressure at the detection blind spots of the third pressure sensors 143 and the third pressure sensors 143 can detect pressure at the detection blind spots of the fourth pressure sensors 144. Therefore, the display substrate as a whole has no detect blind spot, ensuring the accuracy of touch pressure detection. Further, since the third pressure sensors 143 and the fourth pressure sensors 144 are in the display area 11 of the display substrate, the pressure detection is sensitive. Furthermore, the second flexible substrate 15 covers the third pressure sensors 143 and the fourth pressure sensors 144, so the arrangement of the third pressure sensors 143 and the fourth pressure sensors 144 has no effect on the aperture ratio of the display substrate, ensuring that the display substrate has a large aperture ratio. Meanwhile, the third pressure sensors 143 and the fourth pressure sensors 144 are disposed between the first flexible substrate 13 and the second flexible substrate 15, the deformations of the third pressure sensors 143 and the fourth pressure sensors 144 are increased by the deformations of the first flexible substrate 13 and the second flexible substrate 15, ensuring a more sensitive touch pressure detection.

Optionally, an embodiment of the present disclosure further provides a display panel. The display panel includes the display substrate described in the above embodiments. The display panel may further include a counter substrate opposite to the display substrate. The counter substrate may be a color filter substrate, or may be a cover plate or other encapsulation layer.

Figure 7A:
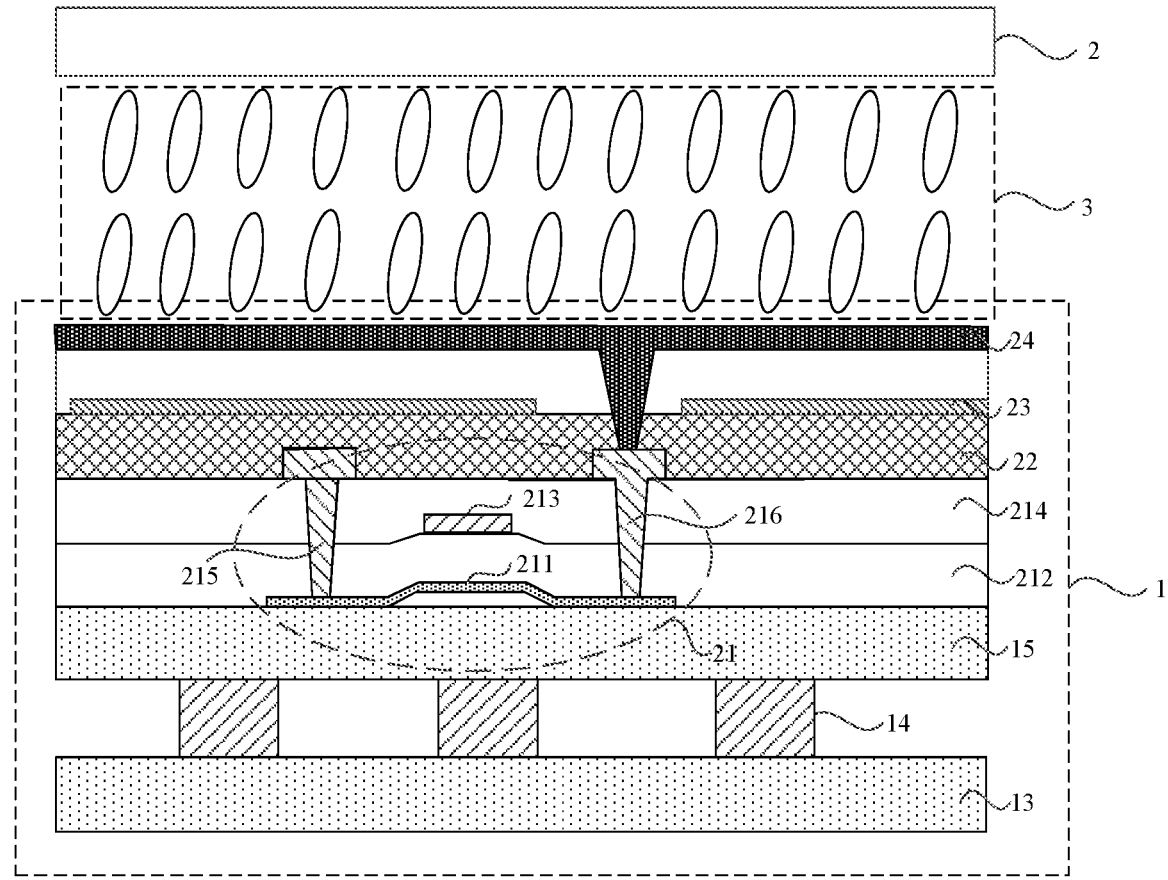
FIG. 7A is a schematic view of a structure of a display panel according to an embodiment of present disclosure.

Specifically, FIG. 7A is a schematic view of a structure of a display panel according to an embodiment of present disclosure. In the present embodiment, the display panel is a liquid crystal display panel. Optionally, the liquid crystal display panel may include a display substrate 1, a counter substrate 2 opposite to the display substrate 1, and a liquid crystal layer 3 sandwiched between the display substrate 1 and the counter substrate 2. The display substrate 1 may be an array substrate, and the counter substrate 2 may be a color filter substrate. The display substrate 1 may include a first flexible substrate 13, a second flexible substrate 15 and a pressure sensor 14 disposed between the first flexible substrate 13 and the second flexible substrate 15. The second flexible substrate 15 covers the pressure sensor 14. Such configurations not only ensure large deformations and high touch pressure detection sensitivity of the pressure sensors 14 under touch pressure, but also ensure that the display substrate has a large aperture ratio that is not affected even if the pressure sensors 14 are disposed in the display area. Optionally, the liquid crystal display panel may further include a thin film transistor 21 disposed on the second flexible substrate 15. The thin film transistor 21 may be a bottom-gate thin film transistor or a top-gate thin film transistor. FIG. 7A exemplarily illustrates the top-gate thin film transistor. Optionally, the thin film transistor 21 may include an active layer 211, a gate insulation layer 212 at a side of the active layer 211 facing away from the second flexible substrate 15, a gate electrode 213 at a side of the gate insulation layer 212 facing away from the active layer 211, an interlayer insulation layer 214 at a side of the gate electrode 213 facing away from the gate insulation layer 212, and a source electrode 215 and a drain electrode 216 at a side of the interlayer insulation layer 214 facing away from the gate electrode 213. Optionally, the liquid crystal display panel may further include a planarization layer 22 disposed at a side of the source electrode 215 and the drain electrode 216 facing away from the interlayer insulation layer 214, and a common electrode 23 and a pixel electrode 24 disposed on the planarization layer 22. The common electrode 23 is electrically connected to the pixel electrode 24. The common electrode 23 may output a common signal in a display phase, and work with the pixel electrode 24 to deflect the liquid crystal molecules in the liquid crystal layer 3 to implement a display function. The common electrode 23 may be reused as a touch electrode and output a touch signal in a touch phase to implement a touch function. Optionally, the counter substrate 2 may include a color filter layer and a black matrix layer (not shown). The normal display of the display panel is achieved by means of the color filter layer and the black matrix layer.

Figure 7B:
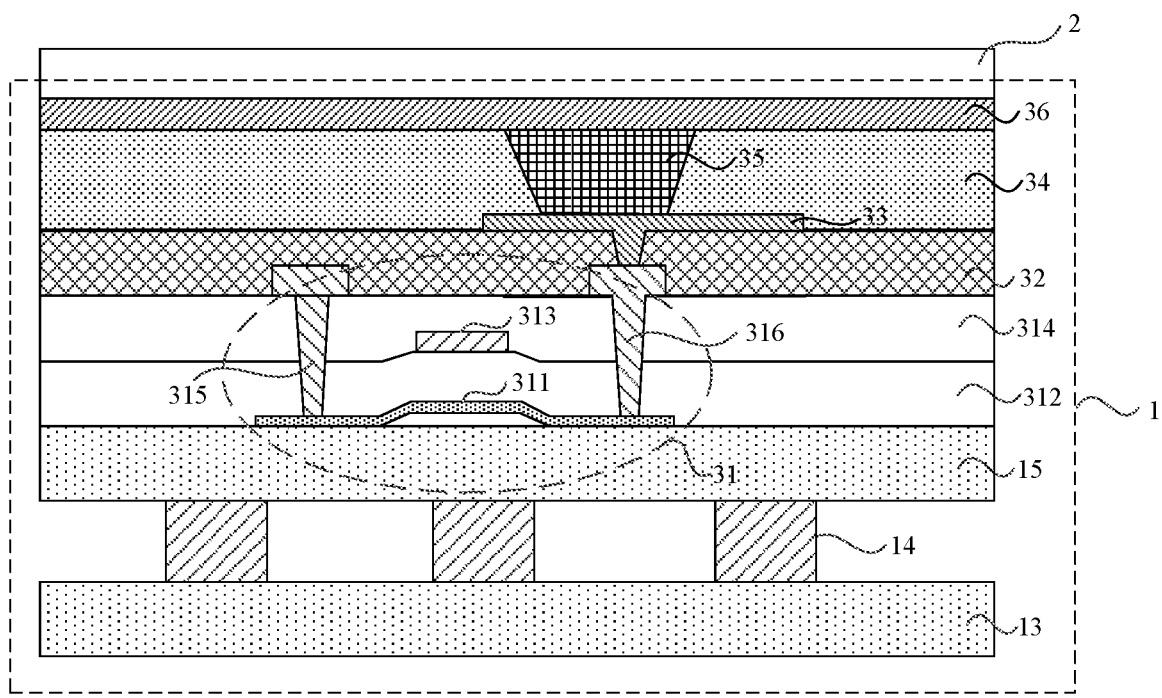
FIG. 7B is a schematic view of a structure of another display panel according to an embodiment of present disclosure.

FIG. 7B is a schematic view of a structure of another display panel according to an embodiment of present disclosure. In the present embodiment, the display panel is an organic light-emitting diode display panel. Optionally, the organic light-emitting diode display panel may include a display substrate 1 and a counter substrate 2 opposite to the display substrate 1. The display substrate 1 may include a first flexible substrate 13, a second flexible substrate 15 and a pressure sensor 14 disposed between the first flexible substrate 13 and the second flexible substrate 15. The second flexible substrate 15 covers the pressure sensor 14. Such configurations not only ensure large deformations and high touch pressure detection sensitivity of the pressure sensors 14 under touch pressure, but also ensure that the display substrate has a large aperture ratio that is not affected even if the pressure sensors 14 are disposed in the display area. Optionally, the organic light-emitting diode display panel may include a thin film transistor 31 disposed on the second flexible substrate 15. The thin film transistor 31 may be a bottom-gate thin film transistor or a top-gate thin film transistor. FIG. 7B exemplarily illustrates the top-gate thin film transistor. Optionally, the thin film transistor 31 may include an active layer 311, a gate insulation layer 312 at a side of the active layer 311 facing away from the second flexible substrate 15, a gate electrode 313 at a side of the gate insulation layer 312 facing away from the active layer 311, an interlayer insulation layer 314 at a side of the gate electrode 313 facing away from the gate insulation layer 312, and a source electrode 315 and a drain electrode 316 at a side of the interlayer insulation layer 314 facing away from the gate electrode 313. Optionally, the liquid crystal display panel may further include a planarization layer 32 disposed at a side of the source electrode 315 and the drain electrode 316 facing away from the interlayer insulation layer 314, and a anode layer 33 disposed on the planarization layer 22. The anode layer 33 is electrically connected to the drain electrode 316. A pixel definition layer 34 is disposed at a side of the anode layer 33 facing away from the planarization layer 22. The pixel definition layer 34 may prevent or reduce color mixing between pixels. An organic light-emitting layer 35 is located on the anode layer 33 and between two adjacent pixel definition layers 34. The organic light-emitting layer 35 may include a hole injection layer, a hole transport layer, an emission layer, an electron transport layer, and an electron injection layer, which are sequentially stacked up. A cathode layer 36 is located on a side of the organic light-emitting layer 35 and the pixel definition layer 34 facing away from the anode layer 33. Optionally, the counter substrate 2 may include a plurality of organic layers and inorganic layers which are stacked up and used for protecting the display substrate 1 from water and oxygen. For convenience of description, only one light-emitting pixel is illustrated in the present embodiment, and in other embodiments, a plurality of light-emitting pixels may be included, and the present disclosure is not limited thereto.

Figure 8:
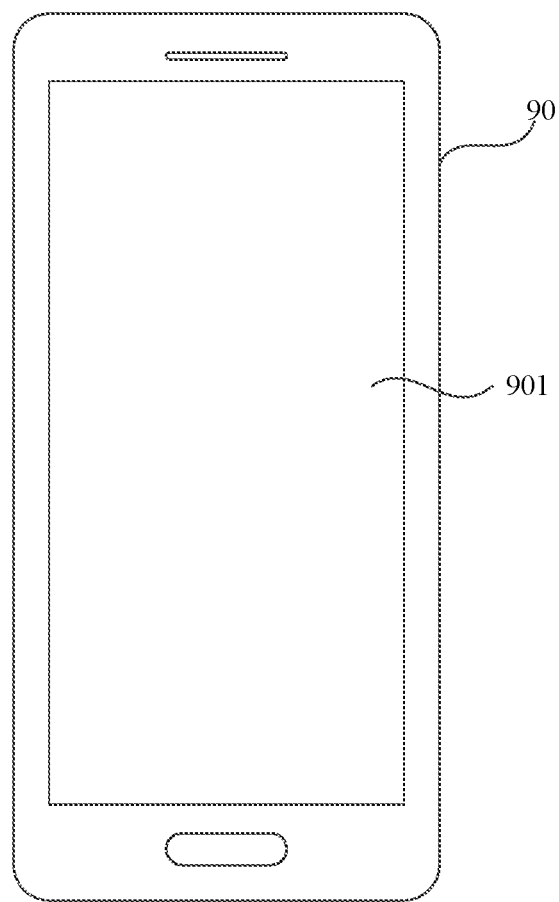
FIG. 8 is a schematic view of a structure of a display device according to an embodiment of present disclosure.

FIG. 8 is a schematic view of a structure of a display device according to an embodiment of present disclosure. As shown in FIG. 8, the display device 90 may include the display panel 901 described in any embodiment of the present disclosure. The display device 90 may be a phone shown in FIG. 8, or may be a computer, a television, or a smart wearable display device. The present disclosure is not particularly limited thereto.

It is noted that the above are only preferred embodiments of the present disclosure and the technical principles employed. It will be understood by those skilled in the art that the present disclosure is not limited to the specific embodiments described herein and that various modifications, adaptations, combinations and substitutions can be made by those skilled in the art without departing from the scope of the present disclosure. Thus, while the present disclosure has been described in detail by way of the above embodiments, the present disclosure is not limited to the above embodiments, and may include equivalent embodiments without departing from the inventive concept, and the scope of present disclosure is determined by the appended claims.

What is claimed is:

1. A display substrate, comprising:
a display area with a non-display area surrounding the display area,
a first flexible substrate;
a plurality of pressure sensors located on the first flexible substrate and in the display area; and
a second flexible substrate located at a side of the plurality of pressure sensors, wherein the second flexible substrate is facing away from the first flexible substrate and covering the plurality of pressure sensors;
wherein the display substrate further comprises a bias voltage signal line and a strain voltage signal line,
wherein the bias voltage signal line and the strain voltage signal line are disposed in a same layer as the plurality of pressure sensors and are electrically connected to each of the plurality of pressure sensors respectively; and
wherein each of the plurality of pressure sensors comprises at least four connecting terminals, wherein the bias voltage signal line is configured to input a bias voltage signal to two opposite ones of the at least four connecting terminals, and wherein the strain voltage signal line is configured to receive a strain voltage signal outputted from other two opposite ones of the at least four connecting terminals.

2. The display substrate of claim 1, further comprising a driver circuit layer located at a side of the second flexible substrate facing away from the plurality of pressure sensors, wherein the second flexible substrate is provided with a contact hole, the bias voltage signal line and the strain voltage signal line are electrically connected to the driver circuit layer via the contact hole.

3. The display substrate of claim 2, wherein the contact hole is disposed between the display area and the non-display area.

4. The display substrate of claim 1, wherein the plurality of pressure sensors is arranged in a matrix, respective two opposite connecting terminals of the pressure sensors in a same column are electrically connected to one voltage signal line, and respective another two opposite connecting terminals of the pressure sensors in the same column are electrically connected to one strain voltage signal line.

5. The display substrate of claim 4, wherein the plurality of pressure sensors includes a first pressure sensor and a second pressure sensor;
wherein the display substrate comprises a plurality of first pressure sensors arranged in a first plurality of rows and a plurality of second pressure sensors arranged in a second plurality of rows, either the plurality of first pressure sensors is in odd-numbered rows and the plurality of second pressure sensors is in even-numbered rows, or the plurality of first pressure sensors is in even-numbered rows and the plurality of second pressure sensors is in odd-numbered rows; and
wherein the plurality of first pressure sensors and the plurality of second pressure sensors are alternately arranged in a column direction.

6. The display substrate of claim 5, wherein each of the plurality of first pressure sensors includes a first detection direction and a second detection direction, and the first detection direction intersects the second detection direction;
wherein each of the plurality of second pressure sensors includes a third detection direction and a fourth detection direction, and the third detection direction intersects the fourth detection direction; and
wherein the first detection direction is the same as the third detection direction, and the second detection direction is the same as the fourth detection direction.

7. The display substrate of claim 4, wherein the plurality of pressure sensors includes at least one third pressure sensor and at least one fourth pressure sensor; and
wherein the display substrate comprises a plurality of third pressure sensors and a plurality of fourth pressure sensors, and the plurality of third pressure sensors and the plurality of fourth pressure sensors are alternately arranged in same rows.

8. The display substrate of claim 7, wherein each of the plurality of third pressure sensors comprises a fifth detection direction and a sixth detection direction, and the fifth detection direction intersects the sixth detection direction;
wherein each of the plurality of fourth pressure sensors comprises a seventh detection direction and an eighth detection direction, and the seventh detection direction intersects the eighth detection direction; and
wherein the fifth detection direction is different from the seventh detection direction, and the sixth detection direction is different from the eighth detection direction.

9. The display substrate of claim 8, wherein an angle between the fifth detection direction and the seventh detection direction is 45 degrees, and an angle between the sixth detection direction and the eighth detection direction is 45 degrees.

10. The display substrate of claim 1, further comprising a flexible plate, wherein the flexible plate is at a side of the first flexible substrate facing away from the plurality of pressure sensors, and a Young's modulus value of the flexible plate is less than that of the first flexible substrate and the second flexible substrate.

11. The display substrate of claim 1, wherein the plurality of pressure sensors is semiconductor pressure sensors.

12. The display substrate of claim 1, wherein the plurality of pressure sensors is bridge pressure sensors.

13. A display substrate, comprising:
a display area with a non-display area surrounding the display area,
a first flexible substrate;
a plurality of pressure sensors located on the first flexible substrate and in the display area; and
a second flexible substrate located at a side of the plurality of pressure sensors, wherein the second flexible substrate is facing away from the first flexible substrate and covering the plurality of pressure sensors;
wherein the plurality of pressure sensors is semiconductor pressure sensors;
wherein each of the semiconductor pressure sensors comprises a first connecting terminal, a second connecting terminal, a third connecting terminal and a fourth connecting terminal, wherein the first connecting terminal is opposite to the third connecting terminal, and the second connecting terminal is opposite to the fourth connecting terminal; and
wherein the first connecting terminal and the third connecting terminal are configured to receive a bias voltage signal, the second connecting terminal and the fourth connecting terminal are configured to output a strain voltage signal, and a first straight line where the first connecting terminal and the third connecting terminal are located intersects a second straight line where the second connecting terminal and the fourth connecting terminal are located.

14. The display substrate of claim 1, material of the first flexible substrate and the second flexible substrate is Polyimide or Nano silver paste.

15. A display panel comprising: a display substrate and a counter substrate opposite to the display substrate, wherein the display substrate comprises:
a display area with a non-display area surrounding the display area;
a first flexible substrate;
a plurality of pressure sensors on the first flexible substrate and in the display area; and
a second flexible substrate located at a side of the plurality of pressure sensors, wherein the second flexible substrate is facing away from the first flexible substrate and covering the plurality of pressure sensors;
wherein the display substrate further comprises a bias voltage signal line and a strain voltage signal line,
wherein the bias voltage signal line and the strain voltage signal line are disposed in a same layer as the plurality of pressure sensors and are electrically connected to each of the plurality of pressure sensors respectively; and
wherein each of the plurality of pressure sensors comprises at least four connecting terminals, the bias voltage signal line is configured to input a bias voltage signal to two opposite ones of the at least four connecting terminals, and the strain voltage signal line is configured to receive a strain voltage signal outputted from other two opposite ones of the at least four connecting terminals.

16. A display device, comprising the display panel according to claim 15.

17. The display substrate of claim 12, wherein each of the bridge pressure sensors comprises a first sense resistor, a second sense resistor, a third sense resistor and a fourth sense resistor; and
wherein a first terminal of the first sense resistor and a second terminal of the fourth sense resistor are electrically connected to a first bias voltage signal input terminal, a second terminal of the first sense resistor and a first terminal of the second sense resistor are electrically connected to a first strain voltage single measuring terminal, a second terminal of the second sense resistor and a first terminal of the third sense resistor are electrically connected to a second bias voltage signal input terminal, and a second terminal of the third sense resistor and a first terminal of the fourth sense resistor are electrically connected to a second strain voltage signal measuring terminal.

18. The display substrate of claim 13, further comprising a bias voltage signal line and a strain voltage signal line,
wherein the bias voltage signal line and the strain voltage signal line are disposed in a same layer as the plurality of pressure sensors and are electrically connected to each of the plurality of pressure sensors respectively; and
wherein each of the plurality of pressure sensors comprises at least four connecting terminals, the bias voltage signal line is configured to input the bias voltage signal to two opposite ones of the at least four connecting terminals, and the strain voltage signal line is configured to receive the strain voltage signal outputted from other two opposite ones of the at least four connecting terminals.

19. The display substrate of claim 18, wherein the plurality of pressure sensors is arranged in a matrix, wherein respective two opposite connecting terminals of the pressure sensors in a same column are electrically connected to one voltage signal line, and wherein respective other two opposite connecting terminals of the pressure sensors in the same column are electrically connected to one strain voltage signal line.

20. The display substrate of claim 19, wherein the plurality of pressure sensors includes a first pressure sensor and a second pressure sensor;
wherein the display substrate comprises a plurality of first pressure sensors arranged in a first plurality of rows and a plurality of second pressure sensors arranged in a second plurality of rows, wherein either the plurality of first pressure sensors is in odd-numbered rows and the plurality of second pressure sensors is in even-numbered rows, or the plurality of first pressure sensors is in even-numbered rows and the plurality of second pressure sensors is in odd-numbered rows; and
wherein the plurality of first pressure sensors and the plurality of second pressure sensors are alternately arranged in a column direction.

\* \* \* \* \*